(12) United States Patent
Ahn et al.

(10) Patent No.: US 6,211,073 B1
(45) Date of Patent: Apr. 3, 2001

(54) METHODS FOR MAKING COPPER AND OTHER METAL INTERCONNECTIONS IN INTEGRATED CIRCUITS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/032,197

(22) Filed: Feb. 27, 1998

(51) Int. Cl.$^7$ .................. H01L 21/4763; H01L 21/44
(52) U.S. Cl. ............................... 438/653; 438/627
(58) Field of Search .................... 438/653, 592, 438/629, 638, 385, 786, 627, 639

(56) References Cited

U.S. PATENT DOCUMENTS

| | | | |
|---|---|---|---|
| 2,842,438 | 7/1958 | Saarivirta et al. | 75/135 |
| 3,954,570 | 5/1976 | Shirk et al. | 201/15 |
| 4,386,116 | 5/1983 | Nair et al. | 427/99 |
| 4,423,547 | 1/1984 | Farrar et al. | 29/571 |
| 4,574,095 | 3/1986 | Baum et al. | 427/53.1 |
| 4,788,082 | 11/1988 | Schmitt | 427/248.1 |
| 4,931,410 | 6/1990 | Tokunaga et al. | 437/189 |
| 4,962,058 | 10/1990 | Cronin et al. | 437/187 |
| 4,996,584 | 2/1991 | Young et al. | 357/71 |
| 5,019,531 | 5/1991 | Awaya et al. | 437/180 |
| 5,100,499 | 3/1992 | Douglas | 156/635 |
| 5,158,986 | 10/1992 | Cha et al. | 521/82 |
| 5,173,442 | 12/1992 | Carey | 437/417 |
| 5,256,205 | 10/1993 | Schmitt, III et al. | 118/723 |
| 5,334,356 | 8/1994 | Baldwin et al. | 422/133 |
| 5,354,712 | 10/1994 | Ho et al. | 437/195 |
| 5,442,237 | 8/1995 | Hughes et al. | 257/759 |
| 5,470,789 | 11/1995 | Misawa | 437/190 |
| 5,470,801 | 11/1995 | Kapoor et al. | 437/238 |
| 5,506,449 | 4/1996 | Nakano et al. | 257/758 |
| 5,635,253 | 6/1997 | Canaperi et al. | 427/437 |
| 5,674,787 | 10/1997 | Zhao et al. | 437/230 |
| 5,679,608 | 10/1997 | Cheung et al. | 437/195 |
| 5,681,441 | 10/1997 | Svendsen et al. | 205/114 |
| 5,695,810 | 12/1997 | Dubin et al. | 427/96 |
| 5,780,358 | 7/1998 | Zhou | 438/645 |

(List continued on next page.)

OTHER PUBLICATIONS

Srivatsa et al., "Jet Vapor Dedposition: an Alternative to Electrodeposition", Surface Engineering, vol. 11, No. 1, pp. 75–77, 1995.*

Palleau, J., et al., "Refractory Metal Encapsulation in Copper Wiring", *Advanced Metallization for Devices and Circuits–Science, Technology and Manufacturability, Materials Research Society Symposium Proceedings*, 337, pp. 225–231, (Apr. 1994).

(List continued on next page.)

*Primary Examiner*—Matthew Smith
*Assistant Examiner*—Calvin Lee
(74) *Attorney, Agent, or Firm*—Schwegman, Lundberg, Woessner & Kluth, P.A.

(57) ABSTRACT

A typical integrated-circuit fabrication requires interconnecting millions of microscopic transistors and resistors with aluminum wires. Yet, aluminum wires have greater electrical resistance and are less reliable than copper wires. Unfortunately, current techniques for making copper wires are time-consuming and inefficient. Accordingly, the invention provides a method of making wires or interconnects from copper or other metals. One embodiment entails forming a first diffusion barrier inside a trench using ionized-magnetron sputtering for better conformal coating of the trench, and a second diffusion barrier outside the trench using jet-vapor deposition. The jet-vapor deposition has an acute angle of incidence which prevents deposition within the trench and thus eliminates conventional etching steps that would otherwise be required to leave the trench free of this material. After formation of the two diffusion barriers, the trench is filled with metal and annealed.

44 Claims, 3 Drawing Sheets

U.S. PATENT DOCUMENTS

| | | | |
|---|---|---|---|
| 5,785,570 | | 7/1998 | Bruni ................................. 445/52 |
| 5,792,522 | | 8/1998 | Jin et al. ............................ 427/575 |
| 5,801,098 | * | 9/1998 | Fiordalice et al. ................. 438/653 |
| 5,891,804 | | 4/1999 | Havemann et al. ................ 438/674 |
| 5,897,370 | | 4/1999 | Joshi et al. ......................... 438/632 |
| 5,911,113 | * | 6/1999 | Yao et al. ........................... 438/649 |
| 5,932,928 | | 8/1999 | Clampitt ............................. 257/758 |
| 5,972,804 | * | 10/1999 | Tobin et al. ........................ 438/786 |
| 5,981,350 | * | 11/1999 | Geusic et al. ...................... 438/386 |
| 5,985,759 | * | 11/1999 | Kim et al. ........................... 438/653 |
| 6,008,117 | * | 12/1999 | Hong et al. ......................... 438/629 |

OTHER PUBLICATIONS

Tsukada, T., et al., "Adhesion of copper films on ABS polymers deposited in an internal magnet magnetron sputtering system", *J. Vac. Sci. Technol.*, 16(2), pp. 348–351, (1979).

In: *Metals Handbook, 8th Edition*, vol. 8, ASM Handbook Committee, (eds.), American Society for Metals, Materials Park, OH, p. 300–302.

In: *Packaging, Electronic Materials Handbook*, vol. 1, ASM International Handbook Committee (eds.), ASM International, Materials Park, OH, 767–772, (1989).

Anonymous, "Formation of Conductors at Variable Depths—Using Differential Photomask, Projecting Images into Insulator by Reactive Ion Etching, Selectively Filling Images with Conductor", *Research Disclosure*, Disclosure No. RD 291015, Abstract, 1 p. (Jul. 10, 1988).

Anonymous, "Improved Metallurgy for Wiring Very Large Scale Integrated Circuits", *International Technology Disclosures*, 4, 1 p., (Sep. 25, 1986).

Braud, E., et al., "Ultra Thin Diffusion Barriers for Cu Interconnections at The Gigabit Generation and Beyond", *VMIC Conference Proceedings*, 174–179, (Jun. 18–20, 1996).

Ding, et al., "Copper Barrier, Seed Layer and Planerization Technologies", *VMIC Conference Proceedings*, 87–92, (Jun. 10–12, 1997).

Godbey, D.J., et al., "Copper Diffusion in Organic Polymer Resists and Inter–level Dielectrics", *Thin Solid Films*, 308–309, 470–474 (1997).

Iijima, T., et al., "Microstructure and Electrical Properties of Amorphous W–Si–N Barrier Layer for Cu Interconnections", *1996 VMIC Conference*, 168–173, (Jun. 18–20, 1996).

Laursen, T., et al., "Encapsulation of Copper by Nitridation of Cu–Ti Alloy/Bilayer Structures", *International Conference on Metallurgical Coatings and Thin Films*, Abstract No. H1.03, San Diego, CA, 309, (Apr. 21–25, 1997).

Murarka, S.P., et al., "Copper Interconnection Schemes: Elimination of The Need of Diffusion Barrier/Adhesion Promoter by the Use of Corrosion Resistant, Low Resistivity Doped Copper", *SPIE*, 2335, 80–90, (Oct. 20–21, 1994).

Saarivirta, M.J., "High Conductivity Copper Rich Cu–Zr Alloys", *Transactions of the Metallurigical Society of AIME*, 218, 431–437, (1960).

Shacham–Diamand, Y., "100 nm Wide Copper Lines Made by Selective Electroless Deposition", *Journal of Micromechanics and Microengineering*, 1, 66–72, (Mar. 1991).

Van Vlack, L.H., *Elements of Materials Science*, Addison–Wesley Publishing Co., Inc. Reading, MA, p. 468, (1959).

Wolf, S., et al., *Silicon Processing for the VLSI Era*, vol. 1—*Process Technology*, Lattice Press, Sunset Beach, CA, p. 514–538, (1986).

"Kirk–Othmer Concise Encyclopedia of Chemical Technology", M. Grayson (ed), Wiley–Interscience, New York, NY, 433–435, 926–938 (1985).

"Properties and Selection: Nonferrous Alloys and Pure Metals", *Metals Handbook Ninth Edition*, 2, ASM International, 157,395, (1979).

Craig, J.D., "Polyimide Coatings", *Electronic Materials Handbook*, ASM International, 1, Packaging, 105, 768–772, (1989).

Jayaraj, K., et al., "Low Dielectric Constant Microcellular Foams", *Proceedings from the Seventh Meeting of the DuPont Symposium on Polymides in Microelectrics*, 474–501, (1996).

Jin, et al., "Porous Xerogel Films as Ultra–low Permitivity Dielectrics for AILS Interconnect Applications", *Advanced Metallization and Interconnect Systems for ULSI Applications*, Boston, MA, (Oct. 1996).

Miller, et al., "Low Dielectric Constant Polyimides and Polyimide Nanofoams", *Seventh Meeting of the DuPont Symposium on Polymides in Microelectronics*, 443–473, (Sep. 1996).

Ramos, T., et al., "Nanoporous Silica for Dielectric Constant Less Than 2", *Advanced Metallization and Interconnect Systems for ULSI Applications*, Boston, MA, (1996).

Ting, C.H., "Low K Material/Process Development", *Multilevel Interconnection State–of–the–Art Seminar*, Santa Clara, CA, 172–212, (Jun. 21, 1996).

Abe, K., et al., "Sub–half Micron Copper Interconnets Using Reflow of Sputtered Copper Films", *VLSI Multilevel Interconnection Conference*, 308–314, (Jun. 25–27, 1995).

Bai, G., et al., "Copper Interconnection Deposition Techniques and Integration", *1996 Symposium on VLSI Technology*, Digest of Technical Papers, 48–49, (1996).

Ernst, et al., "Growth Model for Metal Films on Oxide Surface: Cu on ZnO(0001)–O", *Physical Review B*, vol. 47, No. 20, 13782–96, (1993).

Hirao, S., et al., "A Novel Copper Reflow Process Using Dual Wetting Layers", *1997 Symposium on VLSI Technology*, Digest of Technical Papers, 57–58, (1997).

Izaki, M., et al., "Characterization of Transparent Zinc Oxide Films Prepared by Electrochemical Reaction", *Journal of the Electrochemical Society*, vol. 144, No. 6, 1949–52, (Jun. 1997).

Kang, H.K., et al., *Proceedings of the 10th International VLSI Interconnection Conference*, 223, (1993).

Miyake, T., et al., "Atomic Hydrogen Enhanced Reflow of Copper", *Applied Physics Letters*, vol. 70, No. 10, 1239–41, (1997).

Park, C.W., et al., "Activation Energy for Electromigration in Cu Films", *Applied Physics Letters*, vol. 59, No. 2, 175, (1991).

Rossnagel, S.M., "Magnetron Sputter Deposition of Interconnect Applications", *Conference Proceedings, ULSI XI*, Materials Research Society, 227–32, (1996).

Srivatsa, A.R., et al., "Jet Vapor Deposition: an Alternative to Electrodeposition", *Surface Engineering*, vol. 11, No. 1, 75–77, (1995).

Tao, J., et al., "Electromigration Resistance of Copper Interconnects", *IEEE Electron Devices Letters*, vol. 14, No. 5, 249, (1993).

Wang, X.W., et al., "Highly Reliable Silicon Nitride Thin Films Made by Jet Vapor Deposition", *Japanese Journal of Applied Physics 34*, Pt. 1, No. 23, 955–58, (1995).

* cited by examiner

METHODS FOR MAKING COPPER AND OTHER METAL INTERCONNECTIONS IN INTEGRATED CIRCUITS

FIELD OF INVENTION

The present invention concerns methods of semiconductor device or integrated circuit manufacturing, particularly methods of forming interconnects from copper and other metals.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, together to define a specific electric circuit, such as a computer memory.

Interconnecting millions of microscopic components typically entails covering the components with an insulative layer, etching small holes in the insulative layer to expose portions of the components underneath, and digging trenches in the layer to define a wiring pattern. Then, through metallization, the holes and trenches are filled with metal to form line-like wires between the components. The wires are typically about one micron thick, or about 100 times thinner than a human hair.

Aluminum and its alloys with silicon and copper are the most common metals used for the wires, or interconnects. However, at sub-micron dimensions, that is, dimensions appreciable less than one micron, aluminum-based interconnections present not only higher electrical resistances which waste power and slows down the integrated circuit, but also poor electromigration resistance which lets the aluminum diffuse, or leach, into neighboring structures. This diffusion degrades performance of an integrated circuit, ultimately undermining its reliability. Thus, there is a need to form sub-micron interconnections from metals other than aluminum.

Copper appears, because of its lower electrical resistivity and higher electromigration resistance, to be a promising substitute for aluminum. However, conventional interconnection techniques have proven impractical for making sub-micron interconnects from copper, specifically for filling the quarter-micron-wide holes and trenches thought necessary for tomorrow's smaller, more densely-packed integrated circuits.

For example, when using the conventional metallization technique of sputtering to fill trenches with copper, copper atoms spray out widely (in comparison to the width of the trenches), stick to the sidewalls of the trenches, and then to each other, eventually building bridges, or closures, across a trench and ultimately leaving voids, or wormholes, in the resulting copper wire. Similarly, when sputter-filling small holes with copper, the resulting vias are riddled with voids. These voids not only reduce the physical integrity of the copper interconnects, but also increase their electrical resistance significantly.

One attempt at solving this problem is the Hirao technique disclosed by S. Hirao and his coworkers in their article "A Novel Copper Reflow Process Using Dual Wetting Layers" (Symposium on VLSI Technology, Digest of Technical Papers, pp. 57–58 (1997)). The Hirao technique forms a trench and two diffusion barriers, one inside the trench and the other outside the trench. The inside diffusion barrier consists of a high-wetting, titanium-tungsten, and the outside diffusion barrier consists of a low-wetting, silicon-nitride. Next, the Hirao technique conventionally sputter deposits copper over both the inside and outside diffusion barriers, and afterward executes a reflow step, which heats the copper to 450° C. for 5 minutes in a vacuum. During reflow, the copper flows off the low-wetting, outside diffusion barrier into the trench, where the high-wetting diffusion barrier, to which copper easily sticks, promotes voidless copper consolidation.

Unfortunately, the Hirao technique suffers from at least four drawbacks. First, the technique is time-consuming and inefficient, particularly during formation of the outside diffusion barrier. Forming the outside diffusion barrier entails depositing a sheet of silicon nitride on an insulative layer and then masking and etching through the barrier into the insulative layer to form the trench. This etching is especially time consuming because it must dissolve not only the silicon nitride but also the insulative layer. Second, the Hirao technique forms the inside diffusion barrier using conventional sputtering which fails to yield a lining that conforms accurately to the profile of the trench or hole, ultimately yielding a deformed copper conductor with a smaller cross-section and therefore greater resistance. Third, conventional sputtering deposits the inside barrier material both inside and outside the trench, necessitating an additional scrubbing or polishing step to remove the material outside the trench. Not only is this additional scrubbing step time consuming, but it very likely wears away some of the silicon nitride material forming the outside barrier layer, reducing its effectiveness. Fourth, to control wettability of the barrier layers, the Hirao technique describes an argon-plasma treatment, another time-consuming step that further impairs its practicality.

Accordingly, there remains a need for practical methods of making low-resistance, high-reliability copper interconnections.

SUMMARY OF THE INVENTION

To address these and other needs, the inventors have developed new methods of filling holes and trenches with copper or other desirable metals. Specifically, one embodiment of the invention entails forming a trench or hole, ionized-magnetron sputtering a first material inside the trench or hole, and then jet-vapor depositing a second material outside the trench or hole. Another step fills the trench or hole with copper or other suitable metal.

The preferred embodiment conducts the jet-vapor deposition at an acute incident angle, and uses ionized-magnetron sputtering to fill the trench or hole with copper. In addition, the preferred first material consists essentially of a high-wetting diffusion-barring material, such as tungsten (W), titanium-tungsten (TiW), or titanium nitride (TiN). The second material consists essentially of a low-wetting diffusion-barring material, such as a silicon nitride (SiN) or a zinc oxide (ZnO). Moreover, after filling the trench or hole with copper, the preferred method heats, or anneals, the copper-filled trench, thereby promoting voidless consolidation of the copper within the trench or hole.

The preferred embodiment provides at least two advantages over the Hirao and related techniques. First, in contrast to conventional magnetron sputtering, ionized-magnetron sputtering of the first material and the conductor metal forms a trench lining and a metal conductor that more accurately conforms to the trench profile, thus increasing cross-sectional area of the conductor and ultimately reducing its electrical resistance. Second, jet-vapor deposition at an acute incident angle prevents deposition of the second material into the trench or hole and therefore eliminates not only the time-consuming step of etching through the second material to form the trench or hole, but also the time-consuming step of scrubbing deposited material off areas outside the trench or hole.

DESCRIPTION OF THE PREFERRED EMBODIMENTS

The following detailed description, which references and incorporates FIGS. 1–8, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 1:
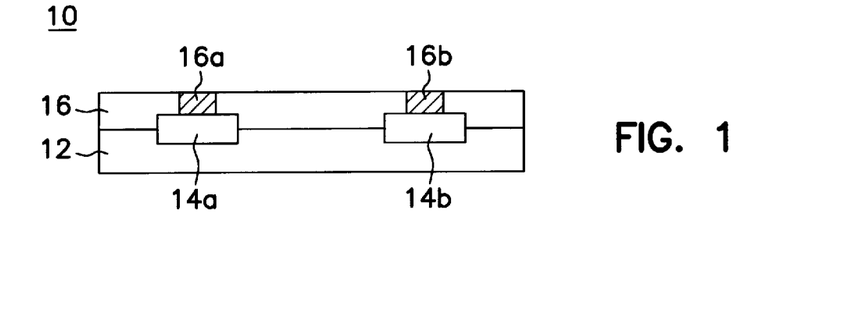
FIG. 1 is a cross-sectional view of an integrated-circuit assembly.

FIGS. 1–8 show a number of preferred integrated-circuit assemblies, which taken collectively and sequentially, illustrate the preferred method of the present invention. The method, as shown in FIG. 1, begins with a known integrated-circuit assembly or structure 10, which can be within any integrated circuit, a dynamic-random-access memory, for example. Assembly 10 includes a substrate 12. The term "substrate," as used herein, encompasses a semiconductor wafer as well as structures having, one or more insulative, conductive, or semiconductive layers and materials. Thus, for example, the term embraces silicon-on-insulator, silicon-on-sapphire, and other advanced structures.

Substrate 12 supports a number of integrated elements 14, preferably transistors 14a and 14b. Transistors 14a and 14b are covered by an insulative layer 16, which preferably comprises silicon oxide, nitride, or oxynitride. Layer 16 includes two aluminum vias 16a and 16b electrically connected to respective transistors 14a and 14b. Although omitted from FIGS. 1–8 for clarity, assembly 10 preferably includes a titanium-nitride diffusion barrier between vias 16a and 16b and transistors 14a and 14b.

Figure 2A:
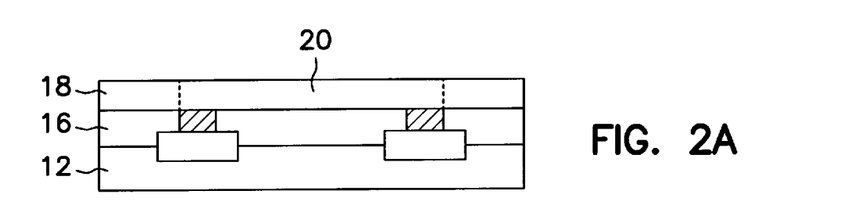
FIG. 2A is a cross-sectional view of the FIG. 1 integrated-circuit assembly after formation of an insulative layer and a trench.

The first step, exemplified in FIG. 2A, entails forming a one-micron-thick insulative layer 18 atop layer 16 and then forming a trench 20 which will ultimately define a desired conductor for connecting vias 16a and 16b. Layer 18, which preferably comprises silicon oxide, may be made using any deposition method. Trench 20 may be made using any selective-material-removal technique, although reactive-ion etching is preferred.

Figure 2B:
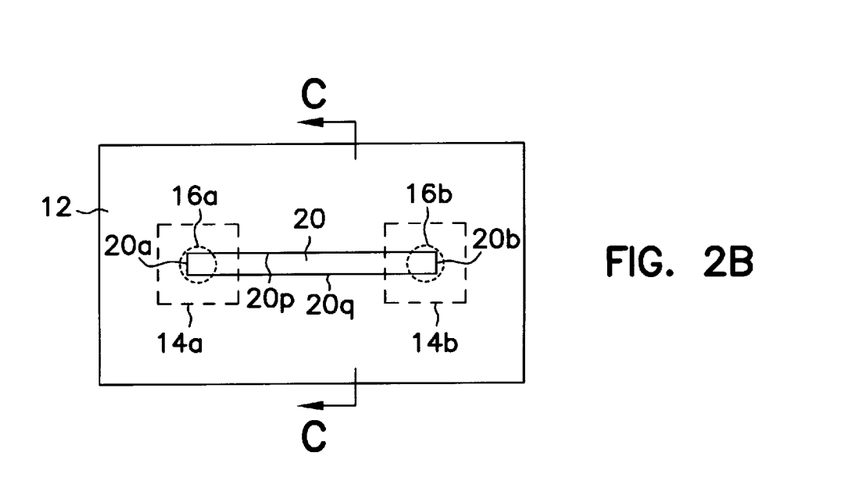
FIG. 2B is a top view of the FIG. 2A integrated-circuit assembly, showing relative position of the trench.
Figure 2C:
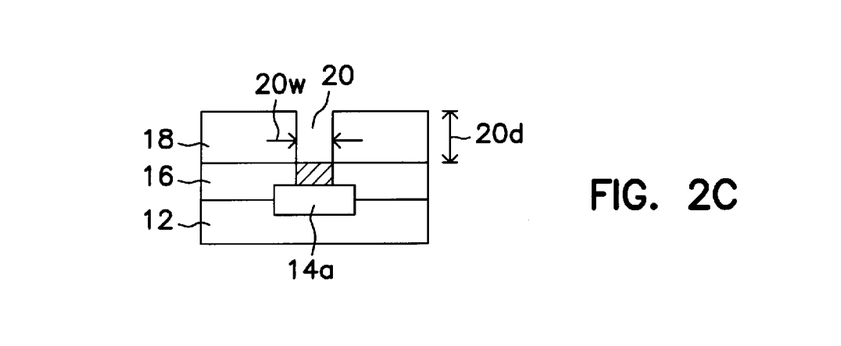
FIG. 2C is another cross-sectional view of the FIG. 2A integrated-circuit assembly, taken along line C—C to show depth and width of the trench.

FIG. 2B presents a top view of the assembly, showing the relative position of trench 20, and FIG. 2C presents a cross-section along line C—C, showing depth 20d and width 20w of trench 20. In the preferred embodiment, trench 20 is less than 0.25 microns wide and at least one micron deep. Other defining features of trench 20 include two substantially parallel longitudinal edges, or perimeter lines, 20p and 20q, which are spaced according to width 20w, and terminal edges 20a and 20b, which determine length of trench 20. The preferred embodiment places terminal edges 20a and 20b over respective vias 16a and 16b.

Figure 3:
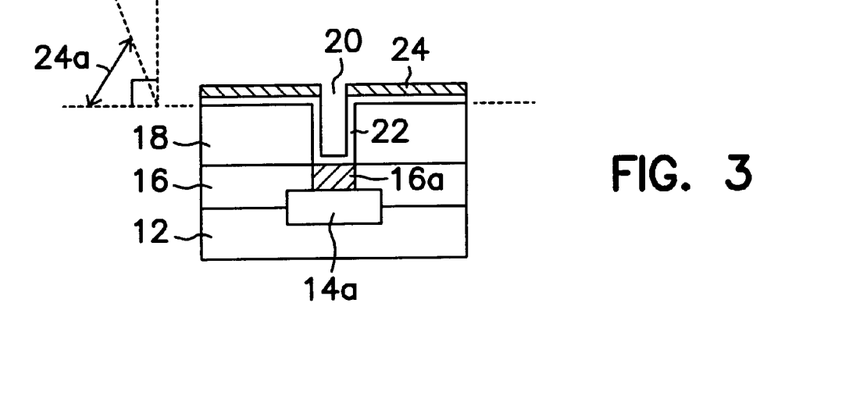
FIG. 3 is a cross-sectional view of the FIG. 2A assembly after formation of two diffusion barriers.

The next step, shown in FIG. 3, a cross-section similar to FIG. 2C, entails lining, or coating, trench 20 with an inside diffusion-barrier 22. In the preferred embodiment, diffusion barrier 22 has a uniform thickness ranging between 50 to 100 nanometers, and comprises tungsten (W), titanium-tungsten (TiW), titanium nitride (TiN), or other high-wetting copper-diffusion-barring material. To conform the inside diffusion barrier to the bottom and sidewalls of trench 20, the preferred method forms diffusion barrier 22 through ionized-magnetron sputtering. Ionized-magnetron sputtering more accurately conforms to the profile of trench 20 than conventional sputtering techniques. This ultimately increases the cross section of the desired conductor, and thus reduces its actual electrical resistance.

The next step entails coating the shoulder or external regions of trench 20 with an outside (relative trench 20) diffusion barrier 24. In the preferred embodiment, outside diffusion barrier 24 comprises a silicon nitride (SiN) or a zinc oxide (ZnO) and is approximately 50 to 100 nanometers thick. Moreover, diffusion barrier 24 has edges adjacent longitudinal edges 20p and 20q and terminal edges 20a and 20b of trench 20. In the preferred embodiment, these edges are substantially even, or flush, with the trench edges to promote optimal reflow of metal into the trench during subsequent annealing steps. In contrast to previous techniques (such as the Hirao technique described in the background) that apply a material on a layer and afterward mask and etch through the material to form a trench (or hole) bordered by the material, the preferred embodiment uses jet-vapor deposition, a high-velocity gas flow technique, to form the outside diffusion barrier after forming the trench, thereby avoiding the time-consuming step of etching through the barrier material.

To achieve this time-savings, the method changes the deposition angle of incidence from the conventional perpendicular incident angle to a glancing incident angle of approximately 86–88 degrees relative the surface plane of layer 18. This is shown as angle 24a in FIG. 3. In the preferred embodiment, the angular relationship is achieved by tilting the integrated-circuit assembly. While maintaining this relationship between the jet-vapor line of deposition and layer 18, the method rotates the integrated-circuit assembly within a horizontal plane using a rotatable substrate holder (not shown). (However, if desired, a jet-vapor output nozzle may itself be rotated about an axis of the stationary assembly.) This procedure forms diffusion barrier 24 outside and not inside trench 20.

For more information on jet-vapor deposition, refer to U.S. Pat. No. 4,788,082 to Schmitt entitled "Method and Apparatus for the Deposition of Solid Films of a Material from a Jet Stream Entraining the Gaseous Phase of said Material" and U.S. Pat. No. 5,256,205 to Schmitt, III et al. entitled "Microwave Plasma Assisted Supersonic Gas Jet Deposition of Thin Film Materials," both of which are incorporated herein by reference. An additional reference, also incorporated herein, is A. R. Srivatsa et al., "Jet Vapor Deposition: An Alternative to Electro-deposition," Institute of Materials (1994). Further information may also be obtained from the Jet Process Corporation of New Haven, Conn.

Figure 4:
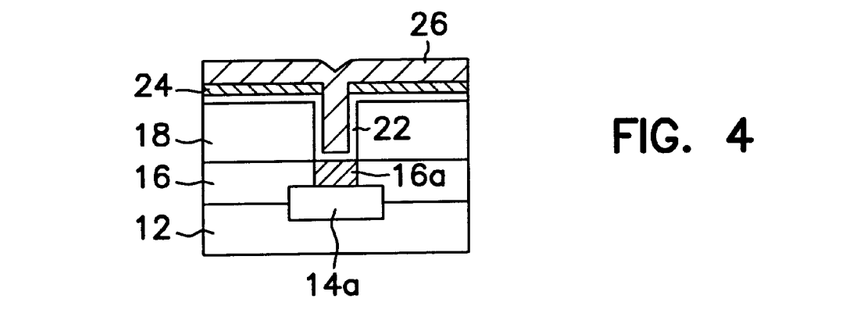
FIG. 4 is a cross-sectional view of the FIG. 3 integrated-circuit assembly after formation of a metal layer.

Next, to form a metal conductor, the method fills trench 20, as shown in FIG. 4, by depositing a metal layer 26 over the trench and surrounding areas, preferably using ionized-magnetron sputtering. For the one-micron deep trench of the preferred embodiment, a minimum 1.2-micron-thick copper layer is deposited. Preferred conditions for the ionized-magnetron sputtering operation are: target power range of 10–30 kilowatts for a 200–300 millimeter diameter wafer (or integrated-circuit assembly), RF coil power at 3–5 kilowatts, negative DC bias of 100–200 volts, sputtering argon gas pressurized at 1–35 millitorrs. Ionized-magnetron sputtering, which provides greater acceleration of the metal deposition material than conventional sputtering, forces the metal to more closely conform to the interior profiles of holes and trenches. This, in turn, reduces the subsequent annealing time and temperature necessary to achieve an effective reflow and consolidation of the metal into a conductor.

Figure 5:
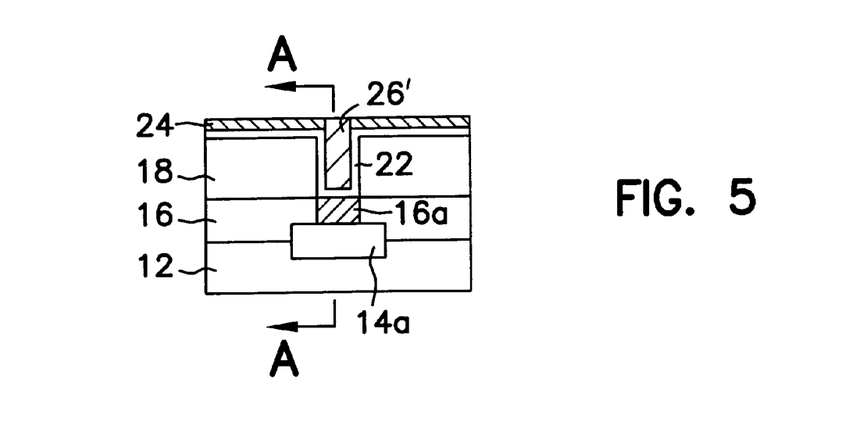
FIG. 5 is a cross-sectional view of the FIG. 4 assembly after removal of a portion of the metal layer.

Following the metal deposition is an annealing step. In the preferred embodiment, annealing proceeds for about 5 minutes at approximately 400° C. or for about 30 minutes at approximately 320° C. in a hydrogen atmosphere. For more details on annealing in hydrogen, refer to T. Miyake et al., "Atomic Hydrogen Enhanced Reflow of Copper," Applied Physics Letters, Vol. 70, 1997, which is incorporated herein by reference. The integrated-circuit assembly is then planarized by chemical-mechanical polishing (CMP) to remove metal remaining outside the trench. FIG. 5 shows resulting metal conductor 26', which electrically connects vias 16a and 16b and therefore connects transistors 14a and 14b. Formation of conductor 26' completes the first level of metallization.

Figure 6A:
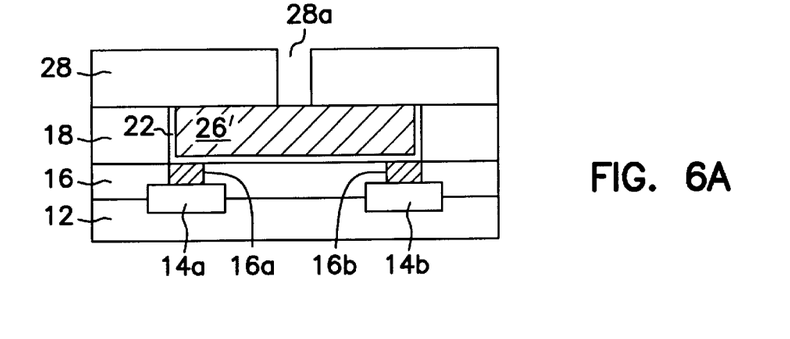
FIG. 6A is a cross-sectional view of the FIG. 5 assembly taken along line A—A after formation of an insulative layer and a via hole.
Figure 6B:
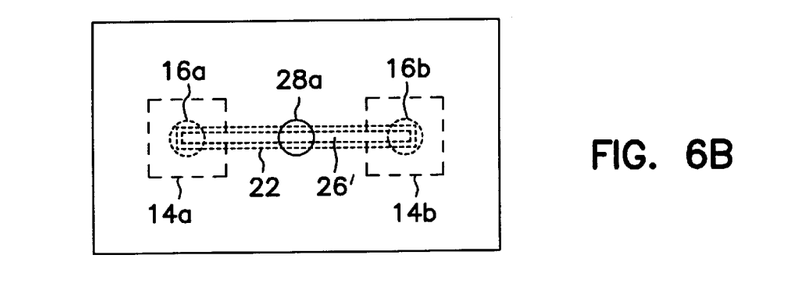
FIG. 6B is a top view of the FIG. 6A assembly, showing relative position of the via hole.
Figure 7:
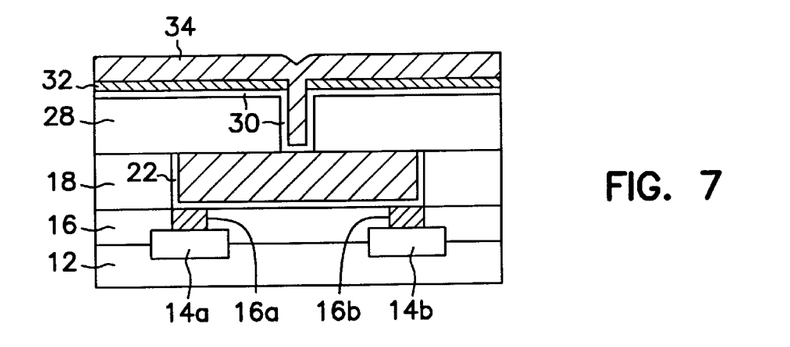
FIG. 7 is a cross-sectional view of the FIG. 6A assembly after formation of two diffusion barriers and another metal layer.

FIG. 6A, a cross-section taken along line A—A in FIG. 5, shows that the second level metallization starts with formation of a one-micron-thick dielectric layer 28 and an approximately quarter-micron-diameter (or larger) via hole 28a. (However, the invention is not limited to particular dimensions.) To enhance performance, dielectric layer 28 should have a dielectric constant as low as possible. The preferred embodiment uses a porous silicon dioxide. (For details on forming this material, see U.S. Pat. No. 5,470,801 entitled "Low Dielectric Constant Insulation Layer for Integrated Circuit Structure and Method of Making Same" which is incorporated herein by reference.) Hole 28a is preferably formed using reactive-ion etching. FIG. 6B shows the position of hole 28a relative transistors 14a and 14b, vias 16a and 16b, and conductor 26' from the first metallization level.

Figure 8:
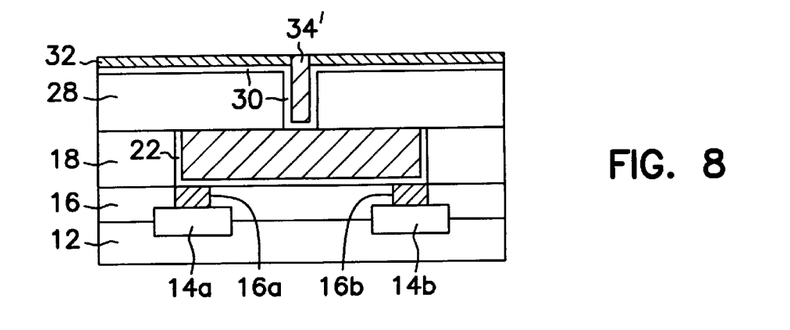
FIG. 8 is a cross-sectional view of the FIG. 7 assembly after removing a portion of the metal layer.

The next steps form an inside diffusion barrier 30 and an outside diffusion barrier 32, both according to the preferred procedures noted above for barriers 22 and 24. Accordingly, formation of inside diffusion barrier 30 entails ionized-magnetron sputtering, and formation of outside diffusion barrier entails jet-vapor deposition at an acute incident angle. Afterward, the preferred method forms a copper layer 34 over the inside and outside diffusion barriers using ionized-magnetron sputtering and then executes an annealing step. FIG. 8 shows that the resulting integrated-circuit assembly includes a copper via 34' electrically connected to underlying conductor 26' and thus also connected to transistors 14a and 14b. Subsequent metallizations would follow similarly.

With completion of the desired number of metallization levels, the preferred method ultimately concludes by heat-treating the integrated circuit for one to six hours at a temperature between 100 and 200° C. This heat treatment, which preferably occurs after packaging the integrated circuit in a protective housing, ensures that the metallic structures have minimum resistivity.

CONCLUSION

The present invention overcomes at least two significant shortcomings of previous interconnection techniques, particularly the Hirao method (described in the background.) First, instead of conventional sputtering to form an inside diffusion barriers, one embodiment of the invention uses ionized-magnetron sputtering to obtain superior sidewall coverage of small via holes and trenches and ultimately yields structures with larger cross sections and thus lower electrical resistance. Second, instead of using conventional techniques which require forming a barrier layer and then etching through it to form a trench, another embodiment uses a tilted jet-vapor deposition which prevents formation of the barrier within the trench and thus eliminates the need to etch through the barrier to form the trench. Moreover, one embodiment of the invention uses zinc oxide, instead of silicon nitride, as an outside diffusion barrier.

The embodiments described above are intended only to illustrate and teach one or more ways of practicing or implementing the present invention, not to restrict its breadth or scope. The actual scope of the invention, which encompasses all ways of practicing or implementing the invention, is defined only by the following claims and their equivalents.

What is claimed is:

1. A method of filling a hole or trench in an integrated-circuit assembly with metal, the method comprising:
   forming a hole or trench in a layer of the integrated-circuit assembly;
   forming a first diffusion barrier inside the hole or trench;
   forming a second diffusion barrier on the layer adjacent the hole or trench through jet-vapor deposition of a diffusion-barring material; and
   at least partially filling the hole or trench with metal after forming the second diffusion barrier.

2. The method of claim 1 wherein forming the first diffusion barrier occurs before forming the second diffusion barrier.

3. The method of claim 1 wherein forming the hole or trench occurs before forming the second diffusion barrier.

4. The method of claim 1 wherein forming the first diffusion barrier comprises ionized-magnetron sputtering of a first diffusion-barring material.

5. The method of claim 1 wherein the metal comprises copper and forming the first diffusion barrier comprises ionized-magnetron sputtering of a copper-diffusion-barring material.

6. The method of claim 1 wherein the metal comprises copper and forming the second diffusion barrier comprises jet-vapor deposition of a copper-diffusion-barring material.

7. The method of claim 1 wherein forming the second diffusion barrier comprises establishing an acute angle of incidence for the jet-vapor deposition of the diffusion-barring material.

8. The method of claim 7 wherein establishing the acute angle of incidence comprises tilting the layer.

9. The method of claim 1 wherein forming the second diffusion barrier comprises rotating the layer about a normal axis of the layer or rotating a jet-vapor nozzle about the normal axis.

10. The method of claim 1 wherein the first diffusion barrier comprises a high-wetting material and the second diffusion barrier comprises a low-wetting material, wherein relative wetting is based on the metal.

11. The method of claim 1 wherein the metal comprises copper.

12. The method of claim 1 wherein the trench or hole has a width not appreciably greater than one-quarter micron.

13. The method of claim 1 wherein the layer consists essentially of an insulative material.

14. The method of claim 1 wherein the trench or hole has a perimeter, and wherein the second diffusion barrier has an edge at least a portion of which is substantially flush with a portion of the perimeter.

15. A method of filling a hole or trench in an integrated-circuit assembly with metal, the method comprising:
   forming a hole or trench in a layer of the integrated-circuit assembly;
   forming a first diffusion barrier inside the hole or trench through magnetron sputtering of a first diffusion-barring material;
   forming a second diffusion barrier outside the hole or trench through jet-vapor deposition of a second diffusion-barring material; and
   at least partially filling the hole or trench with metal after forming the second diffusion barrier.

16. The method of claim 15 wherein the hole or trench has a perimeter, and the second diffusion barrier has an edge at least a portion of which is substantially flush with a portion of the perimeter of the hole or trench.

17. The method of claim 15 wherein forming the first diffusion barrier occurs before forming the second diffusion barrier.

18. The method of claim 15 wherein forming the hole or trench occurs before forming the second diffusion barrier.

19. The method of claim 15 wherein the metal comprises copper; the first diffusion barrier comprises a tungsten, a titanium tungsten, or a titanium nitride; and the second diffusion barrier comprises a zinc oxide.

20. The method of claim 15 wherein forming the second diffusion barrier comprises establishing an acute angle of incidence for the jet-vapor deposition of the second diffusion-barring material.

21. The method of claim 20 wherein establishing the acute angle of incidence comprises tilting the layer.

22. A method of filling a hole or trench in an integrated-circuit assembly with copper, the method comprising:
   forming a hole or trench in an insulative layer of the integrated-circuit assembly, the hole or trench having a perimeter;
   forming a first copper-diffusion barrier inside the hole or trench through magnetron sputtering of a high-copper-wetting diffusion-barring material;
   forming a second copper-diffusion barrier on the insulative layer through jet-vapor deposition of a low-copper-wetting diffusion-barring material, at an acute deposition angle, the second copper-diffusion barrier having an edge substantially flush with at least a portion of the perimeter of the hole or trench;
   at least partially filling the hole or trench with copper; and
   annealing the copper-filled hole or trench.

23. The method of claim 22 wherein forming the first copper-diffusion barrier occurs before forming the second copper-diffusion barrier.

24. The method of claim 23 wherein the acute angle of deposition results from tilting the insulative layer.

25. The method of claim 22 further comprising rotating the insulative layer during formation of the second copper-diffusion barrier.

26. The method of claim 22 wherein the trench or hole has a width not appreciably greater than one-quarter micron.

27. A method of making a metal structure for an integrated circuit, the method comprising:
   forming a hole or trench in an insulative layer, the hole or trench having a perimeter;
   forming a first diffusion barrier inside the hole or trench through magnetron sputtering of a first diffusion-barring material;
   forming a second diffusion barrier on the insulative layer through jet-vapor deposition of a second diffusion-barring material at an acute deposition angle, the second diffusion barrier having an edge substantially flush with at least a portion of the perimeter of the hole or trench;
   depositing metal on the first and second diffusion barriers; and
   annealing the deposited metal and the first and second diffusion barriers.

28. The method of claim 27 wherein forming the first diffusion barrier occurs before forming the second diffusion barrier.

29. The method of claim 27 further comprising rotating the insulative layer during formation of the second diffusion barrier.

30. The method of claim 27 wherein the trench or hole has a width not appreciably greater than one-quarter micron.

31. A method of electrically connecting first and second integrated devices in an integrated circuit, the method comprising:
   forming a first layer including first and second conductive vias electrically coupled to the respective first and second integrated devices;
   forming an insulative layer on the second layer;
   forming a trench in the insulative layer that extends at least from the first conductive via to the second conductive via, the trench having a perimeter;
   forming a first diffusion barrier inside through magnetron sputtering of a first diffusion-barring material;
   forming a second diffusion barrier on the insulative layer and flush with the perimeter of the trench through jet-vapor deposition of a second diffusion-barring material, at an acute deposition angle;
   depositing metal on the first and second diffusion barriers; and
   annealing the deposited metal and the first and second diffusion barriers.

32. A method of filling a hole or trench in an insulative layer with metal, the method comprising:

forming a first diffusion barrier inside the hole or trench through magnetron sputtering of a first diffusion-barring material;

forming a second diffusion barrier outside the hole or trench; and at least partially filling the hole or trench with a metal.

33. The method of claim 32 wherein forming the second diffusion barrier comprises jet-vapor deposition of a second diffusion-barring material at an acute deposition angle.

34. A method of forming a material layer in contact with an edge of a trench or hole, but not within the trench or hole, the method comprising:

forming a trench or hole in the first layer, the trench or hole having an edge; and jet-vapor depositing the material layer on the first layer at an acute deposition angle, after forming the trench or hole.

35. The method of claim 34 further comprising moving the first layer during the jet-vapor deposition.

36. The method of claim 35 wherein moving the first layer comprises rotating the first layer about an axis that is not parallel to a major surface of the first layer.

37. The method of claim 34 wherein the material layer comprises a metal-diffusion-barring material.

38. A method of filling a hole or trench in an integrated-circuit assembly with metal, the method comprising:

forming a hole or trench in a layer of the integrated-circuit assembly;

forming a first diffusion barrier inside the hole or trench;

forming a second diffusion barrier on the layer adjacent the hole or trench through jet-vapor deposition of a diffusion-barring material, wherein forming the second diffusion barrier comprises establishing an acute angle of incidence for the jet-vapor deposition of the diffusion-barring material; and at least partially filling the hole or trench with metal after forming the second diffusion barrier.

39. A method of filling a hole or trench in an integrated-circuit assembly with metal, the method comprising:

forming a hole or trench in a layer of the integrated-circuit assembly;

forming a first diffusion barrier inside the hole or trench;

forming a second diffusion barrier on the layer adjacent the hole or trench through jet-vapor deposition of a diffusion-barring material, wherein forming the second diffusion barrier comprises establishing an acute angle of incidence for the jet-vapor deposition of the diffusion-barring material and rotating the layer about a normal axis of the layer or rotating a jet-vapor nozzle about the normal axis; and at least partially filling the hole or trench with metal after forming the second diffusion barrier.

40. A method of filling a hole or trench in an integrated-circuit assembly with metal, the method comprising:

forming a hole or trench in a layer of the integrated-circuit assembly;

forming a first diffusion barrier inside the hole or trench through magnetron sputtering of a first diffusion-barring material, wherein the first diffusion barrier comprises a high-wetting diffusion-barring material;

forming a second diffusion barrier outside the hole or trench through jet-vapor deposition of a second diffusion-barring material, wherein the second diffusion barrier comprises a low-wetting diffusion-barring material; and at least partially filling the hole or trench with metal after forming the second diffusion barrier.

41. The method of claim 39 wherein the high-wetting diffusion-barring material comprises a tungsten, a titanium tungsten, or a titanium nitride and the low-wetting diffusion-barring material comprises a silicon nitride or a zinc oxide.

42. A method of filling a hole or trench in an integrated-circuit assembly with metal, the method comprising:

forming a hole or trench in a layer of the integrated-circuit assembly;

forming a first diffusion barrier inside the hole or trench through magnetron sputtering of a first diffusion-barring material, wherein the first diffusion barrier comprises a high-wetting diffusion-barring material;

forming a second diffusion barrier outside the hole or trench through jet-vapor deposition of a second diffusion-barring material:
  wherein the second diffusion barrier comprises a low-wetting diffusion-barring material; and
  wherein forming the second diffusion barrier comprises establishing an acute angle of incidence for the jet-vapor deposition of the diffusion-barring material and rotating the layer about a normal axis of the layer or rotating a jet-vapor nozzle about the normal axis; and at least partially filling the hole or trench with metal after forming the second diffusion barrier.

43. A method of filling a hole or trench in an integrated-circuit assembly with metal, the method comprising:

forming a hole or trench in a layer of the integrated-circuit assembly;

forming a first diffusion barrier inside the hole or trench through magnetron sputtering of a first diffusion-barring material, wherein the first diffusion barrier material comprises a tungsten, a titanium tungsten, or a titanium nitride;

forming a second diffusion barrier outside the hole or trench through jet-vapor deposition of a second diffusion-barring material, wherein the second diffusion barrier material comprises a silicon nitride or a zinc oxide; and at least partially filling the hole or trench with metal after forming the second diffusion barrier.

44. A method of filling a hole or trench in an integrated-circuit assembly with metal, the method comprising:

forming a hole or trench in a layer of the integrated-circuit assembly;

forming a first diffusion barrier inside the hole or trench through magnetron sputtering of a first diffusion-barring material, wherein the first diffusion barrier material comprises a tungsten, a titanium tungsten, or a titanium nitride;

forming a second diffusion barrier outside the hole or trench through jet-vapor deposition of a second diffusion-barring material:
  wherein the second diffusion barrier material comprises a silicon nitride or a zinc oxide; and
  wherein forming the second diffusion barrier comprises establishing an acute angle of incidence for the jet-vapor deposition of the diffusion-barring material and rotating the layer about a normal axis of the layer or rotating a jet-vapor nozzle about the normal axis; and at least partially filling the hole or trench with metal after forming the second diffusion barrier.

* * * * *

UNITED STATES PATENT AND TRADEMARK OFFICE
CERTIFICATE OF CORRECTION

PATENT NO. : 6,211,073 B1
DATED : April 3, 2001
INVENTOR(S) : Ahn et al.

Page 1 of 1

It is certified that error appears in the above-identified patent and that said Letters Patent is hereby corrected as shown below:

<u>Column 10, claim 41,</u>
Line 3, delete "claim 39" and insert -- claim 40 --, therefor Signed and Sealed this Twenty-fifth Day of December, 2001

Attest:

Attesting Officer

JAMES E. ROGAN
*Director of the United States Patent and Trademark Office*